United States Patent
Kuo et al.

(10) Patent No.: US 12,261,574 B2
(45) Date of Patent: Mar. 25, 2025

(54) 24 TO 30GHZ WIDE BAND CMOS POWER AMPLIFIER WITH TURN-OFF MODE HIGH IMPEDANCE

(71) Applicant: Samsung Electronics Co., Ltd., Suwon-si (KR)

(72) Inventors: Che-Chun Kuo, San Jose, CA (US); Siu-Chuang Ivan Lu, San Jose, CA (US); Sang Won Son, Palo Alto, CA (US); Xiaohua Yu, San Jose, CA (US)

(73) Assignee: Samsung Electronics Co., Ltd., Yongin-si (KR)

( * ) Notice: Subject to any disclaimer, the term of this patent is extended or adjusted under 35 U.S.C. 154(b) by 0 days.

(21) Appl. No.: 18/207,066

(22) Filed: Jun. 7, 2023

(65) Prior Publication Data

US 2023/0318539 A1    Oct. 5, 2023

Related U.S. Application Data

(63) Continuation of application No. 17/111,337, filed on Dec. 3, 2020, now Pat. No. 11,689,162.

(60) Provisional application No. 63/068,651, filed on Aug. 21, 2020.

(51) Int. Cl.
    *H03F 1/56*            (2006.01)
    *H03F 3/24*            (2006.01)
    *H04B 1/04*           (2006.01)

(52) U.S. Cl.
    CPC .............. *H03F 1/565* (2013.01); *H03F 3/245* (2013.01); *H03F 2200/06* (2013.01); *H03F 2200/165* (2013.01); *H03F 2200/222* (2013.01); *H04B 1/04* (2013.01)

(58) Field of Classification Search
    CPC ................................ H03F 1/565; H03F 3/245
    USPC ....................................................... 330/294
    See application file for complete search history.

(56) References Cited

U.S. PATENT DOCUMENTS

| | | | |
|---|---|---|---|
| 7,408,404 | B2 | 8/2008 | Osman et al. |
| 7,602,240 | B2 | 10/2009 | Gao et al. |
| 8,947,041 | B2 | 2/2015 | Cook et al. |
| 9,780,605 | B2 | 10/2017 | Kurs et al. |
| 9,831,847 | B2 | 11/2017 | Babaie et al. |
| 10,063,191 | B2 | 8/2018 | Sengupta et al. |
| 10,103,696 | B1* | 10/2018 | Mitzlaff ............. H01L 29/0696 |
| 10,439,575 | B1 | 10/2019 | Kuo |
| 2009/0289721 | A1* | 11/2009 | Rajendran ................. H03F 3/72 |
| | | | 330/301 |
| 2012/0075034 | A1* | 3/2012 | Afshari .................. H03B 19/00 |
| | | | 333/101 |
| 2015/0236546 | A1 | 8/2015 | Kesler et al. |
| 2015/0333791 | A1 | 11/2015 | Anderson |
| 2019/0245507 | A1 | 8/2019 | Chi |
| 2019/0334560 | A1 | 10/2019 | Chi |
| 2020/0403586 | A1 | 12/2020 | Cao |

(Continued)

*Primary Examiner* — Patricia T Nguyen
(74) *Attorney, Agent, or Firm* — Lewis Roca Rothgerber Christie LLP (57) ABSTRACT

A wide band matching network for power amplifier impedance matching, the wide band matching network comprising: a power amplifier transistor connected to an output network; the output network including: a series capacitor; an on-chip transformer connected to the capacitor in series, wherein the transformer and the capacitor act as a second order filter; and a port connected to the capacitor and a receiver switch.

19 Claims, 5 Drawing Sheets

(56) References Cited

U.S. PATENT DOCUMENTS

2021/0067183 A1    3/2021  Abbasi
2021/0194125 A1*  6/2021  Bellaouar ............... H03F 3/195

* cited by examiner

24 TO 30GHZ WIDE BAND CMOS POWER AMPLIFIER WITH TURN-OFF MODE HIGH IMPEDANCE

CROSS-REFERENCE TO RELATED APPLICATIONS

The present application is a continuation of U.S. patent application Ser. No. 17/111,337, filed Dec. 3, 2020, which claims priority to U.S. Provisional Patent application 63/068,651, filed Aug. 21, 2020, the entire content of each of which is incorporated herein by reference.

FIELD

The present disclosure is generally related to methods of replacing a switch within a power amplifier network and providing impedance matching.

BACKGROUND 5G millimeter-wave band. Commercial bands: n257 (26.5-29.5 GHZ), n258 (24.25-27.5 GHZ) and n261 (27.5-28.35 GHz). 5G is TDD system, which means TX and RX turn on in individually, switch is solution for TDD system. Switch will degrade TX/Power amplifier performance (insertion loss).

SUMMARY

A wide band matching network for power amplifier impedance matching, the wide band matching network comprising: a power amplifier transistor connected to an output network; the output network including: a series capacitor; an on-chip transformer connected to the capacitor in series, wherein the transformer and the capacitor act as a second order filter; and a port connected to the capacitor and a receiver switch.

The wide band matching network, wherein when the power amplifier is turned on and the receiver is turned off, the output network performs power amplifier matching.

The wide band matching network, wherein when the power amplifier is turned off and the receiver is turned on, the output network acts as impedance.

The wide band matching network, wherein the on-chip transformer is derived from an ideal second order filter, wherein an ideal series capacitor within the second order filter is represented as a first ideal capacitor and a second ideal capacitor, wherein the first ideal capacitor is converted to the series capacitor and the second ideal capacitor is converted to a parasitic capacitor of the on-chip transformer.

The wide band matching network, wherein ideal inductors of an ideal second order filter are converted to parasitic inductors of the on-chip transformer.

The wide band matching network, wherein ideal capacitors of an ideal second order filter are converted to parasitic capacitors of the on-chip transformer and parasitic of power amplifier transistor.

The wide band matching network, wherein ideal resistors in an ideal second order filter are converted to parasitic resistors of power amplifier transistor.

The wide band matching network, wherein the output network comprises a power amplifier balun, wherein the power amplifier balun and the series capacitor act as a transmitter.

A method for operating a power amplifier network, the method comprising: determining whether to operate the power amplifier network in a power amplifier on/receiver-off mode or a power amplifier-off/receiver-on mode; when the power amplifier-on/receiver-off mode is selected, ensuring the power amplifier is on and a receiver switch is off, and performing power amplifier impedance matching; and when the power amplifier-off/receiver-on mode is selected, ensuring the power amplifier is off and the receiver switch is on, wherein the power amplifier network acts as impedance to prevent signal from entering the power amplifier network.

The method wherein the power amplifier network comprises an on-chip transformer that is derived from an ideal second order filter, wherein an ideal series capacitor within the second order filter is represented as a first ideal capacitor and a second ideal capacitor, wherein the first ideal capacitor is converted to the series capacitor and the second ideal capacitor is converted to a parasitic capacitor of the on-chip transformer.

The method wherein the power amplifier network comprises an on-chip transformer in which ideal inductors of an ideal second order filter are converted to parasitic inductors.

The method wherein the power amplifier network comprises an on-chip transformer in which ideal capacitors of an ideal second order filter are converted to parasitic capacitors.

The method wherein the power amplifier network comprises an on-chip transformer in which ideal resistors of an ideal second order filter are converted to parasitic resistors.

The method wherein the power amplifier network comprises a power amplifier balun and a series capacitor, wherein the power amplifier balun and the series capacitor act as a transmitter.

A system for operating a power amplifier network, the system comprising: a processor; and a memory storing non-transitory processor-executable instructions that, when executed by the processor, cause the processor to: determine whether to operate the power amplifier network in a power amplifier on/receiver-off mode or a power amplifier-off/receiver-on mode; when the power amplifier-on/receiver-off mode is selected, ensure the power amplifier is on and a receiver switch is off, and perform power amplifier impedance matching; and when the power amplifier-off/receiver-on mode is selected, ensure the power amplifier is off and the receiver switch is on, wherein the power amplifier network acts as impedance to prevent signal from entering the power amplifier network.

The system wherein the power amplifier network comprises an on-chip transformer that is derived from an ideal second order filter, wherein an ideal series capacitor within the second order filter is represented as a first ideal capacitor and a second ideal capacitor, wherein the first ideal capacitor is converted to the series capacitor and the second ideal capacitor is converted to a parasitic capacitor of the on-chip transformer.

The system wherein the power amplifier network comprises an on-chip transformer in which ideal inductors of an ideal second order filter are converted to parasitic inductors.

The system wherein the power amplifier network comprises an on-chip transformer in which ideal capacitors of an ideal second order filter are converted to parasitic capacitors.

The system wherein the power amplifier network comprises an on-chip transformer in which ideal resistors of an ideal second order filter are converted to parasitic resistors.

The system wherein the power amplifier network comprises a power amplifier balun and a series capacitor, wherein the power amplifier balun and the series capacitor act as a transmitter.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

The electronic device according to one embodiment may be one of various types of electronic devices. The electronic devices may include, for example, a portable communication device (e.g., a smart phone), a computer, a portable multimedia device, a portable medical device, a camera, a wearable device, or a home appliance. According to one embodiment of the disclosure, an electronic device is not limited to those described above.

The terms used in the present disclosure are not intended to limit the present disclosure but are intended to include various changes, equivalents, or replacements for a corresponding embodiment. With regard to the descriptions of the accompanying drawings, similar reference numerals may be used to refer to similar or related elements. A singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, terms such as "1st," "2nd," "first," and "second" may be used to distinguish a corresponding component from another component, but are not intended to limit the components in other aspects (e.g., importance or order). It is intended that if an element (e.g., a first element) is referred to, with or without the term "operatively" or "communicatively", as "coupled with," "coupled to," "connected with," or "connected to" another element (e.g., a second element), it indicates that the element may be coupled with the other element directly (e.g., wired), wirelessly, or via a third element.

As used herein, the term "module" may include a unit implemented in hardware, software, or firmware, and may interchangeably be used with other terms, for example, "logic," "logic block," "part," and "circuitry." A module may be a single integral component, or a minimum unit or part thereof, adapted to perform one or more functions. For example, according to one embodiment, a module may be implemented in a form of an application-specific integrated circuit (ASIC).

In 5G time division duplex (TDD) systems, the transmitter (TX) and receiver (RX) are typically not on at the same time. Either the TX is on and the RX is off, or the TX is off and the RX is on. One method for toggling the TX and RX on and off is via a TX switch and RX switch. When the TX is on, the TX switch is on, and the RX and RX switch are off. And when the RX is on, the RX switch is on, and the TX and the TX switch are off. While the TX switch is turned off, it provides high impedance such that the RX performance is not disturbed or degraded.

For 5G mm-wave systems (3~30 GHz range), power amplifier (PA) output power is very precious. When the system comprises a TX switch, some PA output power is wasted. One of the benefits of the embodiments of this invention is the elimination of the TX switch in the output network that is connected to the PA. The TX may be replaced with a series capacitor to increase the TX-off impedance. Accordingly, the series capacitor may realize the same functionality as the TX switch. However, the TX-off impedance of the series capacitor is typically not as high as TX switch. In some cases, it is preferable to have the lower TX-off impedance of the series capacitor, which may sacrifice RX performance, in order to save more PA output power.

Figure 1A:
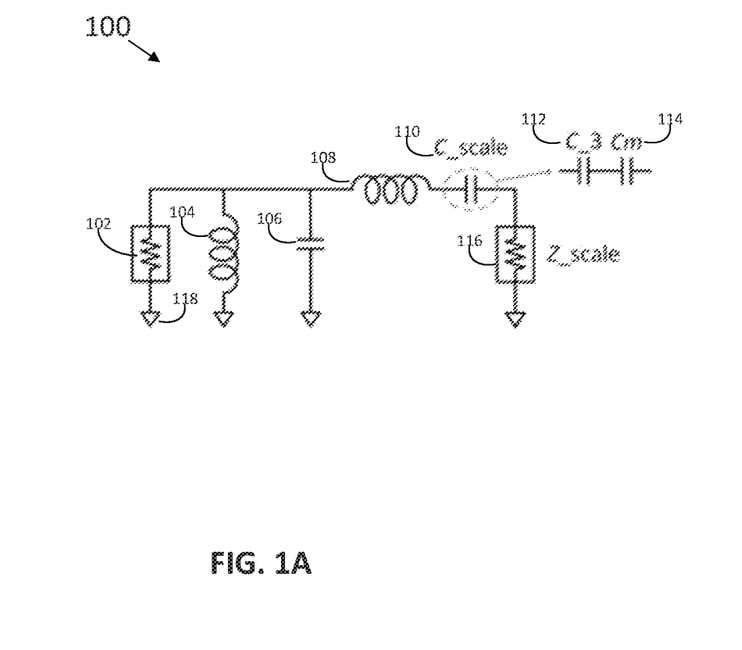
FIG. 1A illustrates a diagram of a second order filter, according to some embodiments.

FIG. 1A illustrates a diagram 100 of a second order filter, according to some embodiments. Resistor_scale (R_scale) 102 is connected to ground 118. Ground 118 may be digital, signal, isolated, common, chassis, earth, or power ground. Inductor_scale (L_scale) 104 and capacitor 1 (C_1) 106 are connected to R_scale 102 in parallel. Inductor 2 (L_2) 108 is connected to R_scale 102, L_scale 104, and C_1 106. Capacitor scale (C_scale) 110 is connected to L_2 108 in series. C_scale 110 may be represented by capacitor 3 (C_3) 112 and capacitor m (Cm) 114. Impedance scale (Z-scale) 116 is connected to L_2 108 and C_scale 110 in series.

Figure 1B:
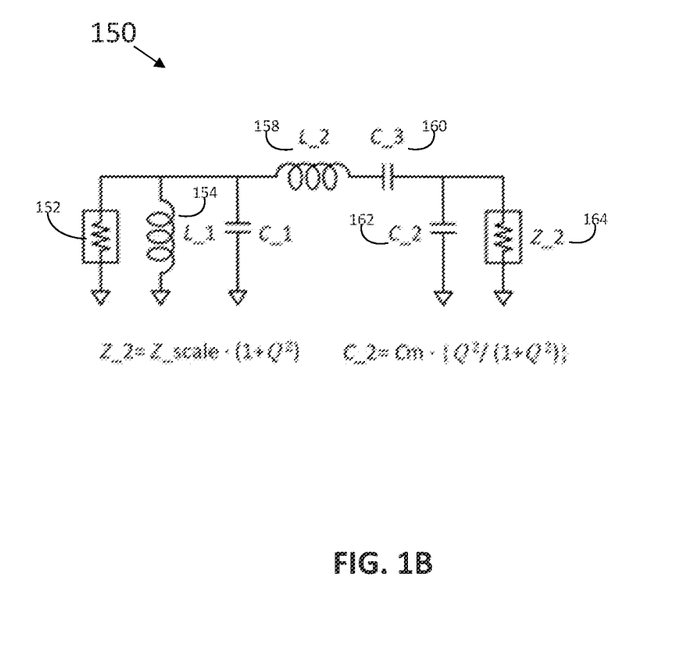
FIG. 1B illustrates a diagram of extraction and Norton transformation of the second order filter of FIG. 1A, according to some embodiments.

FIG. 1B illustrates a diagram 150 of extractions and Norton transformations of the second order filter of FIG. 1A, according to some embodiments. For example, C_scale 110 is substituted with C_3 160 and C_2 162. R_scale 102 is substituted with resistor 1 (R_1) 152. L_scale 104 is substituted by inductor 1 (L_1) 154. Z-scale 116 is substituted with impedance device 2 (Z_2) 164. Inductor 2 (L_2) is in series with C_3 160.

Figure 2:
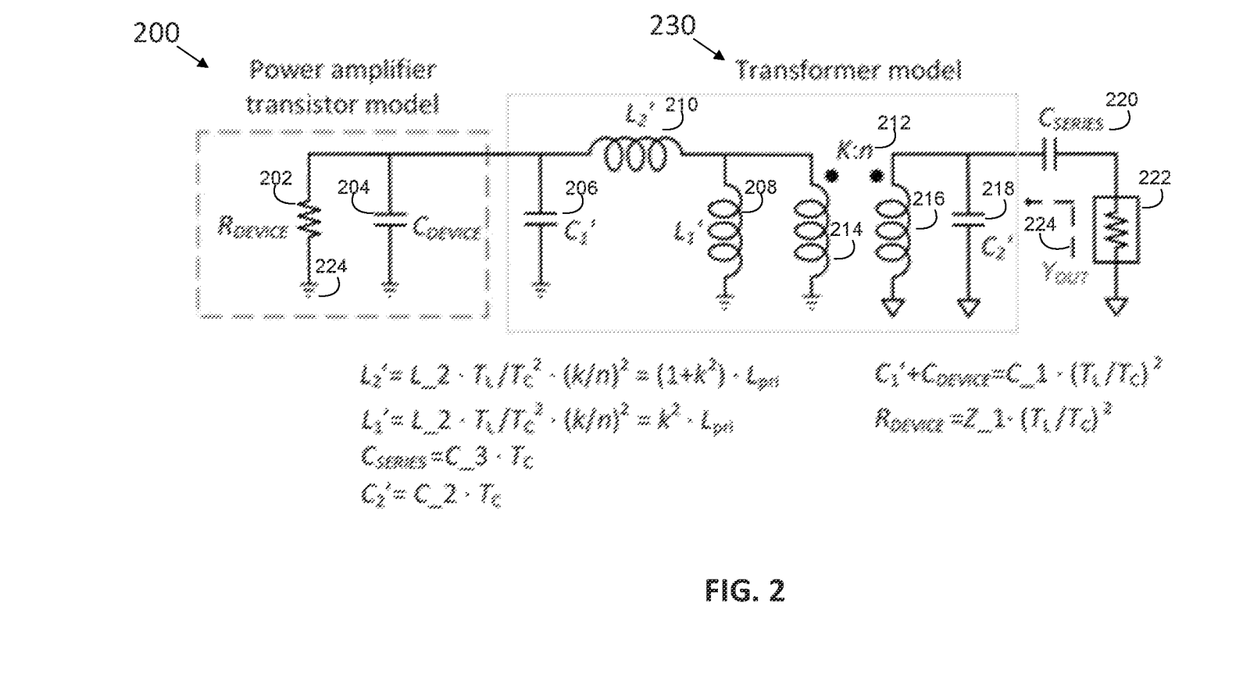
FIG. 2 illustrates a diagram of a power amplifier transistor model and transformer model, according to some embodiments.

FIG. 2 illustrates a diagram of a power amplifier transistor model 200 and transformer model 230, according to some embodiments. The power amplifier transistor model 200 is represented by device resistor 202 connected to ground 224 and device capacitor 204. While the transformer model is represented by $C_1'$ 206, $L_1'$ 208, $L_2'$ 210, ideal transformer coupling inductors, 214 and 216, K (transformer coupling coefficient): n (transformer turn ratio) 212 of the transformer, and $C_2'$ 218. The coupling coefficient, K, may be the ratio of the open-circuit actual voltage ratio to the ratio that would be obtained if all the flux coupled from one circuit to the other. In other words, the fraction of magnetic flux produced by the current in one coil that links with the other coil may be defined as the coupling coefficient between the two transformer coils. $C_{SERIES}$ 220 is a source of impedance in its substitution for a TX switch, thus limiting the receiver admittance Your 224 from. The receiver admittance may also be affected by the antenna termination impedance 222.

Below is an example of some of the mathematics behind the substitutions extractions, and Norton transformations from the second order filters of FIGS. 1A and 1B:

$$Z\_2 = Z\_\text{scale} \cdot (1+Q^2) \quad C\_2 = Cm \cdot \{Q^2/(1+Q^2)\}$$

$$L_2' = L\_2 \cdot T_L/T_C^2 \cdot (k/n)^2 = (1+k^2) \cdot L_{pri} \quad C_1' C_{DEVICE} = C\_1 \cdot (T_L/T_C)^2$$

$$L_1' = L\_2 \cdot T_L/T_C^2 \cdot (k/n)^2 = k^2 \cdot L_{pri} \quad R_{DEVICE} = Z\_1 \cdot (T_L/T_C)^2$$

$$C_{SERIES} = C\_3 \cdot T_C$$

$$C_2' = C\_2 \cdot T_C$$

$T_C$ and $T_L$ are Norton transform coefficients;
$L_{pri}$ are primary turn inductor of the transformer;
k is the transformer coupling coefficient; and
n is the transformer turn ratio.

Figure 3A:
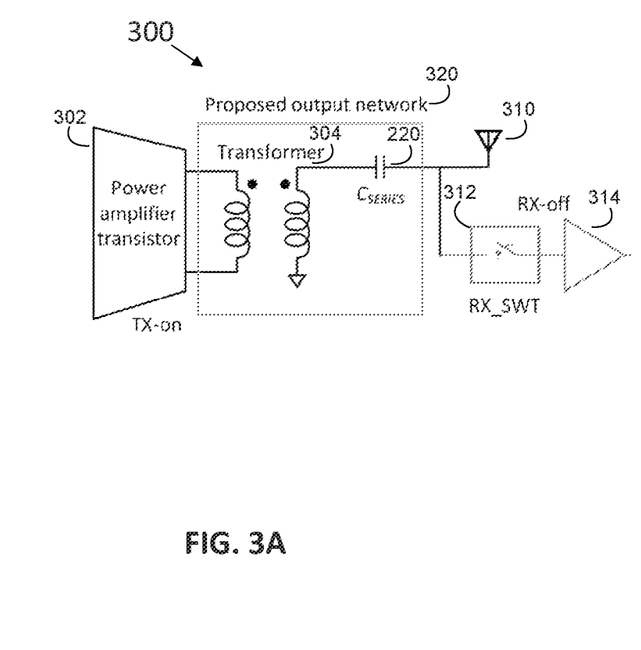
FIG. 3A illustrates a diagram of a power amplifier network in PA-on/receiver-off operation, according to some embodiments.

FIG. 3A illustrates a diagram 300 of a power amplifier network in PA-on/receiver-off operation, according to some embodiments. Here, the power amplifier transistor 302 is connected to the proposed output network 320. The proposed output network 320 may comprise the transformer 304 and $C_{SERIES}$ 220. Signals may be transmitted via transmitter 310. In PA-on/receiver-off operation mode 300, the RX switch off position 312 is activated to prevent the receiver 314 from receiving signal. The transformer 304 and $C_{SERIES}$ 220 perform power amplifier impedance matching. Reference to the transmitter (TX) here may refer to the combination of a power amplifier balun within the network and the series capacitor. The balun may be an electrical device that converts between a balanced signal and an unbalanced signal. The balun may take many forms and may include devices that also transform impedances. The balun may also be used to connect lines of differing impedance. When the PA 302 is on (TX is on), signal may be radiated from the PA 302 through the TX and output network 320 to the antenna/port 310, or signal may be delivered to the TX from the PA 302. When TX 310 and PA 302 are on, RX 314 is off.

Figure 3B:
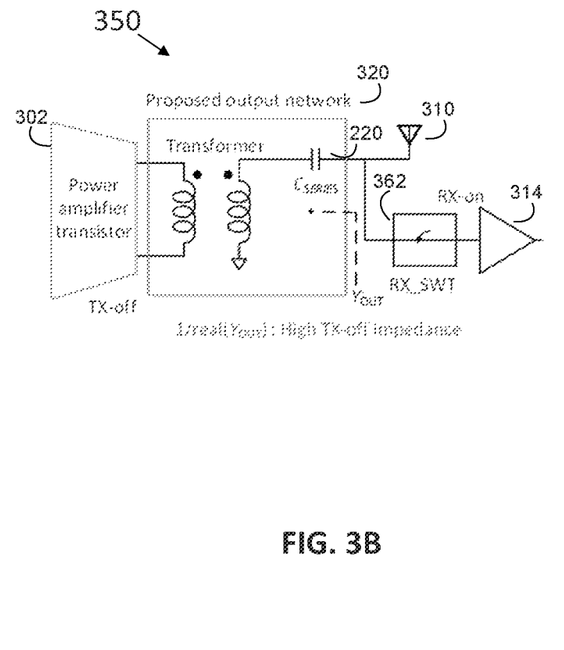
FIG. 3B illustrates a diagram of a power amplifier network in PA-off/receiver-on operation, according to some embodiments.

FIG. 3B illustrates a diagram 350 of a power amplifier network in PA-off/receiver-on operation, according to some embodiments. When the TX and PA 302 are off, the RX 314 is on and the RX switch is in the on position 362. In this case, the network 320 exhibits high impedance to isolate the TX from the RX 314.

PA-off/receiver-on operation impedance may be calculated as follows:

$$\text{PA-off/receiver-on impedance} = 1/Y_{OUT}$$

Once the TX is off and RX 314 is on, signal is received from antenna 310 then goes into the receiver 314. In addition, a device within the PA 302 may turn off when RX 314 is on.

Figure 4:
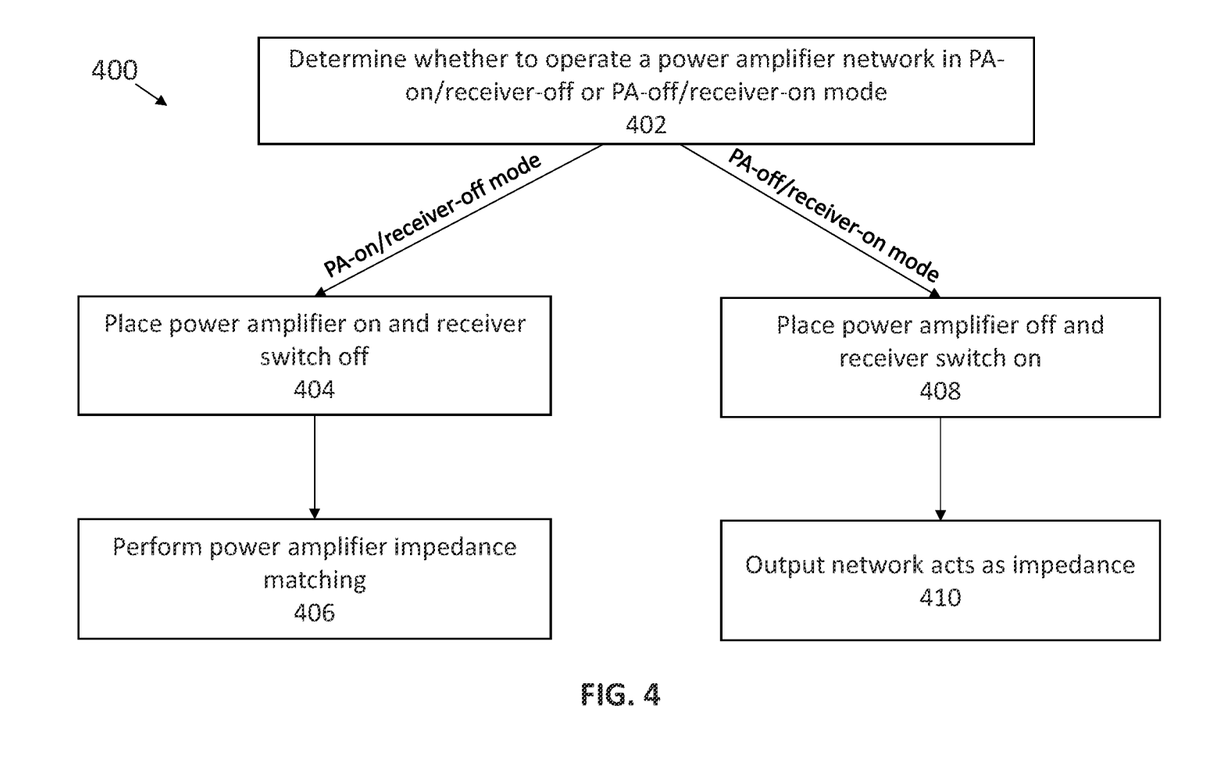
FIG. 4 illustrates a flowchart of operating a power amplifier network, according to some embodiments.

FIG. 4 illustrates a flowchart 400 of operating a power amplifier network, according to some embodiments. At step 402, processor circuitry or another circuit element may determine whether to operate a power amplifier network in PA-on/receiver-off or PA-off/receiver-on mode. When PA-on/receiver-off is selected, the power amplifier is on and the receiver is off 404. The state of the PA and receiver may be verified and toggled to their appropriate states or maintained if already in their proper states. At step 406, the output network may perform power amplifier impedance matching.

When PA-off/receiver-on mode is selected, the power amplifier is off and the receiver and receiver switch are on 408. At step 410, the output network may act as impedance to obstruct a signal from reaching the transmitter. This impedance may be facilitated, at least in part, by a series capacitor in the network.

Figure 5:
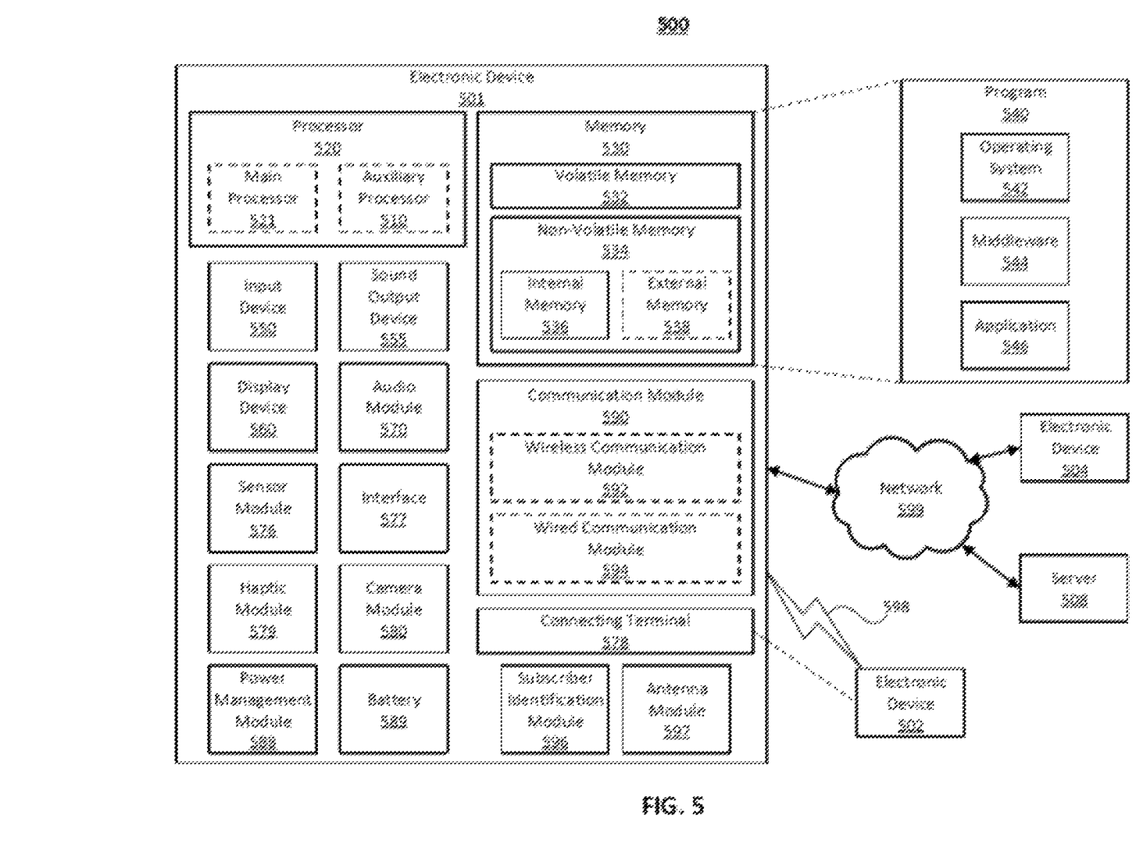
FIG. 5 illustrates a block diagram of an electronic device in a network environment, according to some embodiments.

FIG. 5 illustrates a block diagram of an electronic device 501 in a network environment 500, according to one embodiment. Referring to FIG. 5, the electronic device 501 in the network environment 500 may communicate with another electronic device 502 via a first network 598 (e.g., a short-range wireless communication network), or another electronic device 504 or a server 508 via a second network 599 (e.g., a long-range wireless communication network). The electronic device 501 may also communicate with the electronic device 504 via the server 508. The electronic device 501 may include a processor 520, a memory 530, an input device 550, a sound output device 555, a display device 560, an audio module 570, a sensor module 576, an interface 577, a haptic module 579, a camera module 580, a power management module 588, a battery 589, a communication module 590, a subscriber identification module (SIM) 596, or an antenna module 597. In one embodiment, at least one (e.g., the display device 560 or the camera module 580) of the components may be omitted from the electronic device 501, or one or more other components may be added to the electronic device 501. In one embodiment, some of the components may be implemented as a single integrated circuit (IC). For example, the sensor module 576 (e.g., a fingerprint sensor, an iris sensor, or an illuminance sensor) may be embedded in the display device 560 (e.g., a display).

The processor 520 may execute, for example, software (e.g., a program 540) to control at least one other component (e.g., a hardware or a software component) of the electronic device 501 coupled with the processor 520, and may perform various data processing or computations. As at least part of the data processing or computations, the processor 520 may load a command or data received from another component (e.g., the sensor module 576 or the communication module 590) in volatile memory 532, process the command or the data stored in the volatile memory 532, and store resulting data in non-volatile memory 534. The processor 520 may include a main processor 521 (e.g., a central processing unit (CPU) or an application processor (AP)), and an auxiliary processor 510 (e.g., a graphics processing unit (GPU), an image signal processor (ISP), a sensor hub processor, or a communication processor (CP)) that may be operable independently from, or in conjunction with, the main processor 521. Additionally or alternatively, the auxiliary processor 510 may be adapted to consume less power than the main processor 521, or execute a particular function. The auxiliary processor 510 may be implemented as being separate from, or a part of, the main processor 521.

The auxiliary processor 510 may control at least some of the functions or states related to at least one component (e.g., the display device 560, the sensor module 576, or the communication module 590) among the components of the electronic device 501, instead of the main processor 521 while the main processor 521 may be in an inactive (e.g., sleep) state, or together with the main processor 521 while the main processor 521 may be in an active state (e.g., executing an application). According to one embodiment, the auxiliary processor 510 (e.g., an image signal processor or a communication processor) may be implemented as part of another component (e.g., the camera module 580 or the communication module 590) functionally related to the auxiliary processor 510.

The memory 530 may store various data used by at least one component (e.g., the processor 520 or the sensor module 576) of the electronic device 501. The various data may include, for example, software (e.g., the program 540) and input data or output data for a command related thereto. The memory 530 may include the volatile memory 532 or the non-volatile memory 534.

The program 540 may be stored in the memory 530 as software, and may include, for example, an operating system (OS) 542, middleware 544, or an application 546.

The input device 550 may receive a command or data to be used by other component (e.g., the processor 520) of the electronic device 501, from the outside (e.g., a user) of the electronic device 501. The input device 550 may include, for example, a microphone, a mouse, or a keyboard.

The sound output device 555 may output sound signals to the outside of the electronic device 501. The sound output device 555 may include, for example, a speaker or a receiver. The speaker may be used for general purposes, such as playing multimedia or recording, and the receiver may be used for receiving an incoming call. According to one embodiment, the receiver may be implemented as being separate from, or a part of, the speaker.

The display device 560 may visually provide information to the outside (e.g., a user) of the electronic device 501. The display device 560 may include, for example, a display, a hologram device, or a projector and control circuitry to control a corresponding one of the display, hologram device, and projector. According to one embodiment, the display device 560 may include touch circuitry adapted to detect a touch, or sensor circuitry (e.g., a pressure sensor) adapted to measure the intensity of force incurred by the touch.

The audio module 570 may convert a sound into an electrical signal and vice versa. According to one embodiment, the audio module 570 may obtain the sound via the input device 550, or output the sound via the sound output device 555 or a headphone of an external electronic device 502 directly (e.g., wired) or wirelessly coupled with the electronic device 501.

The sensor module 576 may detect an operational state (e.g., power or temperature) of the electronic device 501 or an environmental state (e.g., a state of a user) external to the electronic device 501, and then generate an electrical signal or data value corresponding to the detected state. The sensor module 576 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 577 may support one or more specified protocols to be used for the electronic device 501 to be coupled with the external electronic device 502 directly (e.g., wired) or wirelessly. According to one embodiment, the interface 577 may include, for example, a high definition multimedia interface (HDMI), a universal serial bus (USB) interface, a secure digital (SD) card interface, or an audio interface.

A connecting terminal 578 may include a connector via which the electronic device 501 may be physically connected with the external electronic device 502. According to one embodiment, the connecting terminal 578 may include, for example, an HDMI connector, a USB connector, an SD card connector, or an audio connector (e.g., a headphone connector).

The haptic module 579 may convert an electrical signal into a mechanical stimulus (e.g., a vibration or a movement) or an electrical stimulus which may be recognized by a user via tactile sensation or kinesthetic sensation. According to one embodiment, the haptic module 579 may include, for example, a motor, a piezoelectric element, or an electrical stimulator.

The camera module 580 may capture a still image or moving images. According to one embodiment, the camera module 580 may include one or more lenses, image sensors, image signal processors, or flashes.

The power management module 588 may manage power supplied to the electronic device 501. The power management module 588 may be implemented as at least part of, for example, a power management integrated circuit (PMIC).

The battery 589 may supply power to at least one component of the electronic device 501. According to one embodiment, the battery 589 may include, for example, a primary cell which may be not rechargeable, a secondary cell which may be rechargeable, or a fuel cell.

The communication module 590 may support establishing a direct (e.g., wired) communication channel or a wireless communication channel between the electronic device 501 and the external electronic device (e.g., the electronic device 502, the electronic device 504, or the server 508) and performing communication via the established communication channel. The communication module 590 may include one or more communication processors that are operable independently from the processor 520 (e.g., the AP) and supports a direct (e.g., wired) communication or a wireless communication. According to one embodiment, the communication module 590 may include a wireless communication module 592 (e.g., a cellular communication module, a short-range wireless communication module, or a global navigation satellite system (GNSS) communication module) or a wired communication module 594 (e.g., a local area network (LAN) communication module or a power line communication (PLC) module). A corresponding one of these communication modules may communicate with the external electronic device via the first network 598 (e.g., a short-range communication network, such as Bluetooth™, wireless-fidelity (Wi-Fi) direct, or a standard of the Infrared Data Association (IrDA)) or the second network 599 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 592 may identify and authenticate the electronic device 501 in a communication network, such as the first network 598 or the second network 599, using subscriber information (e.g., international mobile subscriber identity (IMSI)) stored in the subscriber identification module 596.

The antenna module 597 may transmit or receive a signal or power to or from the outside (e.g., the external electronic device) of the electronic device 501. According to one embodiment, the antenna module 597 may include one or more antennas, and, therefrom, at least one antenna appropriate for a communication scheme used in the communication network, such as the first network 598 or the second network 599, may be selected, for example, by the communication module 590 (e.g., the wireless communication module 592). The signal or the power may then be transmitted or received between the communication module 590 and the external electronic device via the selected at least one antenna.

At least some of the above-described components may be mutually coupled and communicate signals (e.g., commands or data) therebetween via an inter-peripheral communication scheme (e.g., a bus, a general purpose input and output (GPIO), a serial peripheral interface (SPI), or a mobile industry processor interface (MIPI)).

According to one embodiment, commands or data may be transmitted or received between the electronic device 501 and the external electronic device 504 via the server 508 coupled with the second network 599. Each of the electronic devices 502 and 504 may be a device of a same type as, or a different type, from the electronic device 501. All or some of operations to be executed at the electronic device 501 may be executed at one or more of the external electronic devices 502, 504, or server 508. For example, if the electronic device 501 should perform a function or a service automatically, or in response to a request from a user or another device, the electronic device 501, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 501. The electronic device 501 may provide the outcome, with or without further processing of the outcome, as at least part of a reply to the request. To that end, a cloud computing, distributed computing, or client-server computing technology may be used, for example.

One embodiment may be implemented as software (e.g., the program 540) including one or more instructions that are stored in a storage medium (e.g., internal memory 536 or external memory 538) that may be readable by a machine (e.g., the electronic device 501). For example, a processor of the electronic device 501 may invoke at least one of the one or more instructions stored in the storage medium, and execute it, with or without using one or more other components under the control of the processor. Thus, a machine may be operated to perform at least one function according to the at least one instruction invoked. The one or more instructions may include code generated by a complier or code executable by an interpreter. A machine-readable storage medium may be provided in the form of a non-transitory storage medium. The term "non-transitory" indicates that the storage medium may be a tangible device, and does not include a signal (e.g., an electromagnetic wave), but this term does not differentiate between where data may be semi-permanently stored in the storage medium and where the data may be temporarily stored in the storage medium.

According to one embodiment, a method of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to one embodiment, each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In this case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. A wide band matching network, comprising:
a power amplifier transistor connected to an output network;
the output network including:
a capacitor;
an on-chip transformer connected to the capacitor in series, wherein the on-chip transformer and the capacitor act as a second order filter; and
a port connected to the capacitor and a receiver switch, wherein the output network acts as impedance to prevent signal from entering the output network when the power amplifier transistor is off and the receiver switch is on.

2. The wide band matching network of claim 1, wherein when the power amplifier transistor is on and the receiver switch is off, the output network performs power amplifier matching.

3. The wide band matching network of claim 1, wherein the on-chip transformer is derived from an ideal second order filter, wherein an ideal series capacitor within the second order filter is represented as a first ideal capacitor and a second ideal capacitor, wherein the first ideal capacitor is converted to the capacitor and the second ideal capacitor is converted to a parasitic capacitor of the on-chip transformer.

4. The wide band matching network of claim 1, wherein ideal inductors of an ideal second order filter are converted to parasitic inductors of the on-chip transformer.

5. The wide band matching network of claim 1, wherein ideal capacitors of an ideal second order filter are converted to parasitic capacitors of the on-chip transformer and parasitic capacitors of power amplifier transistor.

6. The wide band matching network of claim 1, wherein ideal resistors in an ideal second order filter are converted to parasitic resistors of power amplifier transistor.

7. The wide band matching network of claim 1, wherein the output network comprises a power amplifier balun, wherein the power amplifier balun and the capacitor act as a transmitter.

8. A method, comprising:
determining whether to operate a power amplifier network in a power amplifier-on/receiver-off mode or a power amplifier-off/receiver-on mode;
when the power amplifier-on/receiver-off mode is selected, ensuring a power amplifier is on and a receiver switch is off, and performing power amplifier impedance matching; and
when the power amplifier-off/receiver-on mode is selected, ensuring the power amplifier is off and the receiver switch is on, wherein the power amplifier network acts as impedance to prevent signal from entering the power amplifier network.

9. The method of claim 8, wherein the power amplifier network comprises an on-chip transformer that is connected to a capacitor in series and is derived from an ideal second order filter, wherein the on-chip transformer and the capacitor act as a second order filter, wherein an ideal series capacitor within the second order filter is represented as a first ideal capacitor and a second ideal capacitor, wherein the first ideal capacitor is converted to the capacitor and the second ideal capacitor is converted to a parasitic capacitor of the on-chip transformer.

10. The method of claim 8, wherein the power amplifier network comprises an on-chip transformer in which ideal inductors of an ideal second order filter are converted to parasitic inductors.

11. The method of claim 8, wherein the power amplifier network comprises an on-chip transformer in which ideal capacitors of an ideal second order filter are converted to parasitic capacitors.

12. The method of claim 8, wherein the power amplifier network comprises an on-chip transformer in which ideal resistors of an ideal second order filter are converted to parasitic resistors.

13. The method of claim 8, wherein the power amplifier network comprises a power amplifier balun and a series capacitor, wherein the power amplifier balun and the series capacitor act as a transmitter.

14. A system, comprising:
a processor; and
a memory storing non-transitory processor-executable instructions that, when executed by the processor, cause the processor to:
determine whether to operate a power amplifier network in a power amplifier-on/receiver-off mode or a power amplifier-off/receiver-on mode;
when the power amplifier-on/receiver-off mode is selected, ensure a power amplifier is on and a receiver switch is off, and perform power amplifier impedance matching; and
when the power amplifier-off/receiver-on mode is selected, ensure the power amplifier is off and the receiver switch is on, wherein the power amplifier network acts as impedance to prevent signal from entering the power amplifier network.

15. The system of claim 14, wherein the power amplifier network comprises an on-chip transformer that is connected to a capacitor in series and is derived from an ideal second order filter, wherein the on-chip transformer and the capacitor act as a second order filter, wherein an ideal series capacitor within the second order filter is represented as a first ideal capacitor and a second ideal capacitor, wherein the first ideal capacitor is converted to the capacitor and the second ideal capacitor is converted to a parasitic capacitor of the on-chip transformer.

16. The system of claim 14, wherein the power amplifier network comprises an on-chip transformer in which ideal inductors of an ideal second order filter are converted to parasitic inductors.

17. The system of claim 14, wherein the power amplifier network comprises an on-chip transformer in which ideal capacitors of an ideal second order filter are converted to parasitic capacitors.

18. The system of claim 14, wherein the power amplifier network comprises an on-chip transformer in which ideal resistors of an ideal second order filter are converted to parasitic resistors.

19. The system of claim 14, wherein the power amplifier network comprises a power amplifier balun and a series capacitor, wherein the power amplifier balun and the series capacitor act as a transmitter.

* * * * *